United States Patent [19]

Mentesana

[11] 4,175,813

[45] Nov. 27, 1979

[54] TAMPER-PROOF ADAPTOR FOR AN ELECTRIC METER

[76] Inventor: John P. Mentesana, 1430 Seigart Blvd., Far Rockaway, N.Y. 11691

[21] Appl. No.: 890,009

[22] Filed: Mar. 24, 1978

[51] Int. Cl.² ............................................. G01R 1/00
[52] U.S. Cl. ...................................... 339/36; 324/110; 361/364
[58] Field of Search ............................ 324/110, 156; 361/369–372, 375, 364; 339/36, 37, 40, 154 R, 154 A, 155 R, 156 R, 198 M

[56] References Cited

U.S. PATENT DOCUMENTS 3,167,690   1/1965   Wallman ............................... 361/364

FOREIGN PATENT DOCUMENTS 697464   9/1953   United Kingdom ....................... 339/40

Primary Examiner—Neil Abrams
Attorney, Agent, or Firm—McAulay, Fields, Fisher & Goldstein

[57] ABSTRACT

A tamper-proof adaptor is secured to an electric meter or is formed as a part thereof to form a unitary device which, upon first being plugged into a conventional wall pan and thereafter being removed therefrom, automatically restrains reinsertion of the device into the wall pan. The forces necessary to disengage the device from the wall pan are utilized to physically disengage the meter prongs from extension prongs within the adaptor and, thereafter, an insulating bar is disposed blockingly between the extension prongs and the meter prongs to prevent reconnection thereof.

8 Claims, 7 Drawing Figures

TAMPER-PROOF ADAPTOR FOR AN ELECTRIC METER

BACKGROUND OF THE INVENTION

1. Field of the Invention

This invention relates to a tamper-proof adapter for an electric meter and, more particularly, to a device which is intended to prevent successful unobtrusive tampering of an electric meter.

2. Description of the Prior Art

The electric meter, with which this device is concerned, is the familiar meter by which most utility companies measure electric consumption. Although attempts to bypass or otherwise defeat the electric utility company in obtaining a full measure of the electric power consumed by the paying customer have probably been made for as long as electric companies have existed, more and more attempts are now being made to steal electric power from the utility companies in view of the sudden and precipitous increase in electric costs in recent years.

For a variety of reasons the electric companies have been unable to successfully enforce their claims for stolen electric power in the Courts in a vast majority of cases. One reason is the difficulty in establishing the identity of the true culprit. For example, the present meters are provided with a simple sealing lock to secure the housing of the meter in a closed condition. However, it is a relatively easy matter for a culprit to break the seal, remove the meter from the conventional wall pan or socket, and reinsert it backwards thereby causing the meter to run in reverse to indicate less consumption. This requires little effort, is fairly unobtrusive and, when discovered, can be disclaimed as the work of a passing unknown vandal. Furthermore, once the seal is broken, the meter can be temporarily removed and by the "jumping of wires", one can obtain a period of free use of electricity. Here, again, it is difficult to identify the culprit, and the customer often denies any participation in the act.

Heretofore, various proposals have been made to prevent the tampering with an electric meter; such as disclosed in U.S. Pat. No. 3,334,276. The invention in this patent provides for a switch and locking arrangement in the form of an adaptor, or as an internal part of a meter, for coupling the recording head with the meter socket. The locking mechanism is operable by a key and, thus, is subject to acts of vandalism usually experienced when dealing with key-lock mechanisms.

In another proposal, as disclosed in U.S. Pat. No. 2,099,761, a safety switch box is provided which, among other features, is designed to prevent wiring around the meter. The invention provides a short circuiting device within the switch box, operable when the main switch is open, which short circuits the work circuits so that no current can pass into the work circuits until the main switch is closed.

Still another proposal to reduce the likelihood of a consumer tapping the power lines outside the meter box to by-pass the meter is disclosed in U.S. Pat. No. 2,059,742. These latter two patents involve circuitry features which materially increase the cost of the meter, and which require periodic costly maintenance to maintain the meter and the associated circuitry in proper working condition.

It is recognized that no absolutely full proof system will probably ever be devised to eleminate all theft of electric current. However, there is an urgent need for an inexpensive device which will substantially reduce the likelihood of such theft taking place. In most situations, the vandal's first inclination is to remove the meter from the wall pan or socket. Thus, it is believed that tampering may be substantially lessened if it is known that the meter, once removed from the wall pan, cannot be reconnected thereto.

In most cases, removal of the meter will serve to disconnect electric service to the customer and prevent free use of electricity. However, even where the wires have been "jumped", the fact that the meter cannot be reinserted into its socket will serve as an indication that someone tampered with the meter, and thereby alert the utility company to the unlawful act.

SUMMARY OF THE INVENTION

Briefly stated, the invention comprises an adaptor having extension prongs corresponding to the prongs on an electric meter. The extension prongs are freely supported in slots formed in the adaptor and have, at one end, a female socket adapted to receive the prongs of the electric meter. The other end of the prongs are adapted to be received in the sockets of a conventional wall pan thereby providing electrical connection between the meter and the pan via the adaptor.

When the adaptor and meter are assembled to form a single unit, each meter prong is inserted into the female socket at the end of a corresponding adaptor extension prong. This supports the adaptor extension prongs and allows the assembly to be inserted into the wall pan or socket without special equipment. The end of each adaptor prong adapted to engage with the corresponding wall pan socket preferably has an offset portion which requires that the adaptor be forcibly connected to the pan.

Once inserted in the socket, removal of the unit generates sufficient pulling force between the adaptor prongs and the wall pan sockets to pull the prongs, and the female sockets carried thereon, out of engagement with the electric meter prongs. This results in a series of "floppy" free-floating extension prongs. To prevent the realignment of these prongs and reconnection with the meter prongs, a spring loaded insulator or bar is pulled across the end of the meter prongs to prevent or block reconnection thereof to the adaptor prongs. In this regard, the insulator is biased against the adaptor prongs when the adaptor and meter are assembled in a single unit. However, when the adaptor prongs are pulled away from the meter prongs, the insulator is urged, under influence of a spring, to a position located between the socket ends of the adaptor prongs and the meter prongs to interfere with or block reconnection of said prongs. In order to reconnect said prongs, the combined unit must be taken to the repair shop and disassembled whereupon the insulator is displaced to its non-blocking position thereby permitting reconnection of said prongs. The meter and adaptor may then be assembled, again, into a single unit and installed for use in the field.

Accordingly, it is an object of the present invention to provide an adaptor which is secured to, or formed as part of, an electric meter to form a unitary device, and which, after once having been inserted into its associated wall pan, cannot be reinserted upon subsequent removal therefrom.

It is another object of the invention to provide an adaptor for an electric meter to form a unitary device, and which includes a blocking mechanism to prevent electrical connection between the meter and the adaptor once the device is removed from the associated wall pan or socket.

Additional features and advantages of the present invention will become more apparent from a consideration of the detailed description when taken in conjunction with the accompanying drawings.

DESCRIPTION OF THE PREFERRED EMBODIMENT

Figure 1:
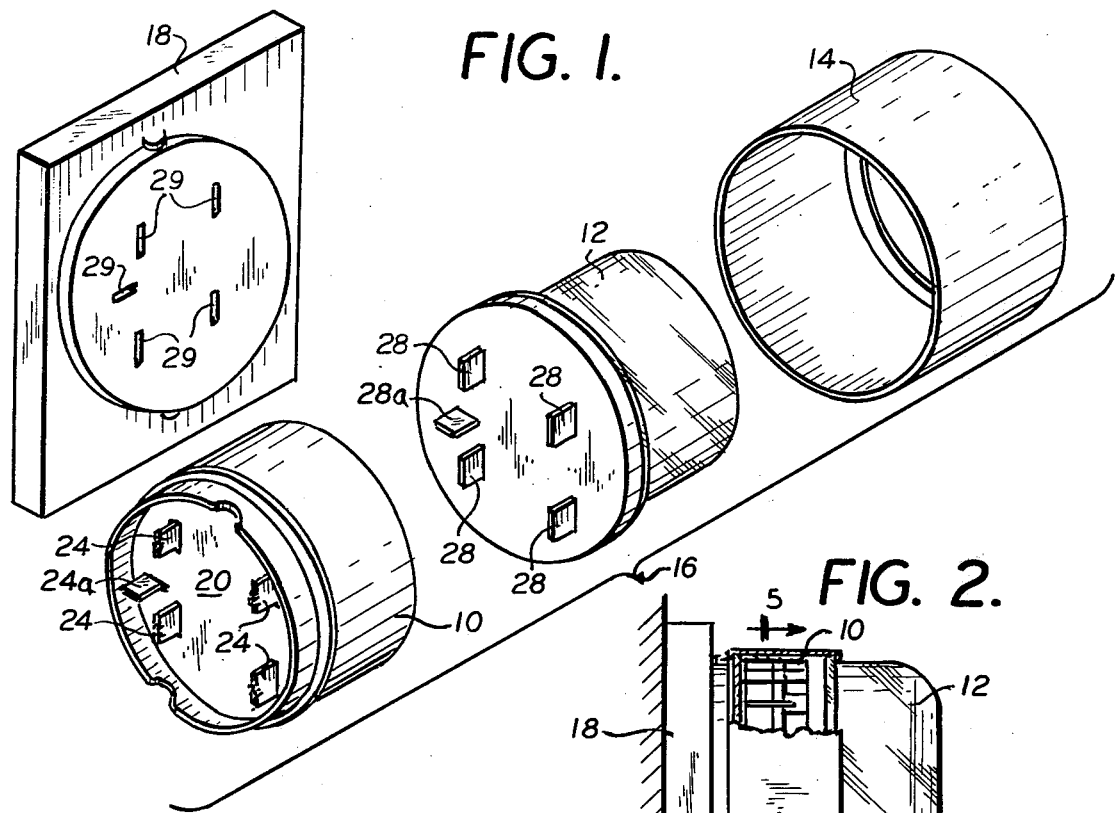
FIG. 1 is an exploded view of a conventional electric meter, an adaptor constructed in accordance with the present invention and a connector ring, all of which are intended to be assembled into a single unit, and a conventional wall pan or socket adapted to receive said unit.
Figure 2:
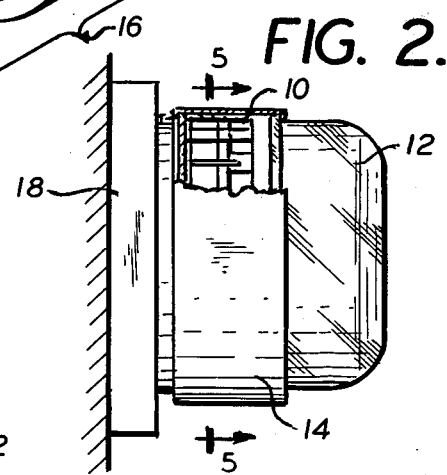
FIG. 2 is a side elevational view of the parts of FIG. 1 assembled and connected together.

In the preferred embodiment shown in the drawings, the present invention is in the form of a tamper-proof adaptor to be secured to an electric meter to form a unitary device. With reference to FIG. 1, the adaptor 10 is sealingly connected to an electric meter 12 by means of a collar member 14, using usual means to so secure the devices together as to form a unitary unit represented generally by the numeral 16. When assembled, the device is intended to be connected to a conventional wall pan or socket 18 as shown in FIG. 2.

Figure 7:
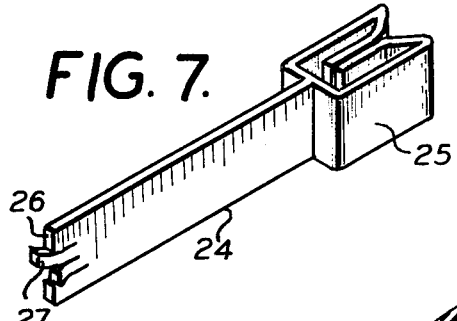
FIG. 7 is a perspective view of one of the adaptor extension prongs.

Adaptor 10 has a support wall 20 formed with a plurality of openings 22 through each of which projects an extension prong 24. An additional non-aligned prong 24a represents the so-called "neutral" contact of the adaptor. As can be best seen in FIG. 7, each extension or adaptor prong 24 is constructed having one end shaped in the form of a female socket 25. The opposite end 26 is formed having an off-set portion 27. Prong 24a is constructed similar to prong 24 and, accordingly, no separate drawing is deemed necessary to illustrate the same. Prongs 24, 24a are constructed of metal and provide electrical connection between meter 12 and wall pan 18 in the manner hereinafter described.

Meter 12 is conventional in construction and is formed having contact prongs 28 and so-called neutral prong 28a adapted to be received in an associated one of the adaptor prong sockets 25. Wall pan 18 is also conventional and is formed having accommodating openings 29 each adapted to receive the end 26 of one of the adaptor prongs 24 and 24a. The construction is such that meter prongs 28 and 28a engage adaptor sockets 25, 25a, whereupon collar 14 serves to seal or otherwise secure the assembly together as unit 16. The term "seal" is used to mean that access to the internal mechanism of the meter 12 or the adaptor 10 is not possible without disassembling the entire unit 16 which requires that it be taken out of service. Thus, any necessary repairs would have to be done in a service shop, and not in the field.

In connecting the assembled unit 16 to wall pan 18, it is necessary to forcibly engage the ends 26 of adaptor prongs 24, 24a into the associated pan openings 29 due to the off-set portions 27 of said prongs. The force required to make such connection is substantially greater than that required to engage meter prongs 28, 28a into the associated sockets 25 of the adaptor prongs 24, 24a. Thus, upon removing unit 16 from wall pan 18, the meter prongs 28, 28a will first disengage from the adaptor prong sockets 25 before the adaptor prongs 24,24a disengage from the wall pan openings 29.

It is noted that when unit 16 is disassembled, the adaptor prongs 24, 24a are supported within adaptor 10 merely by means of the support wall openings 22. The prongs are inserted from the open end that receives the meter 12 and cannot pass entirely through the rear support wall 20 because of the female socket portions 25 which are sized substantially greater than the openings 22 in said wall 20. When unit 16 is assembled, prongs 24, 24a are further supported by meter 12 due to the engagement of meter prongs 28, 28a into the associated sockets 25 of adaptor prongs 24, 24a.

Figure 5:
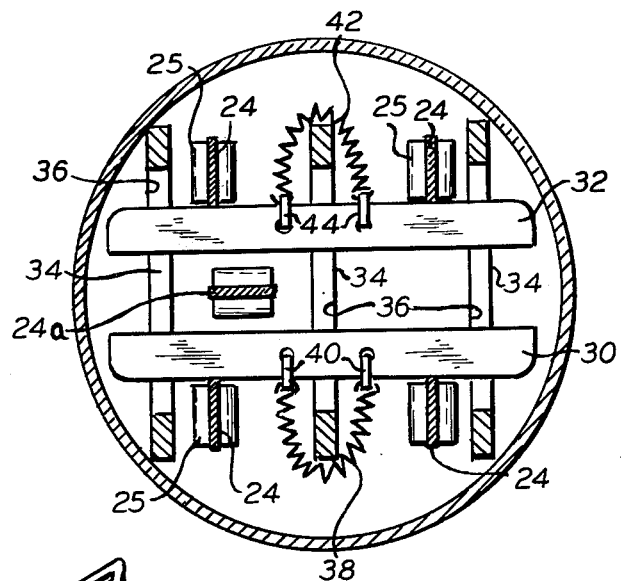
FIG. 5 is an enlarged sectional view taken along line 5—5 of FIG. 2 showing the insulating bars in their non-blocking position.
Figure 6:
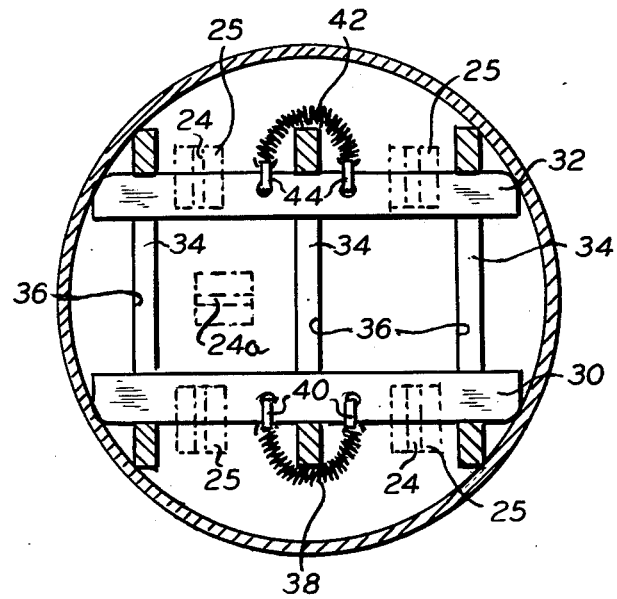
FIG. 6 is a view similar to FIG. 5 with the spring loaded insulating bars pulled into their blocking positions to prevent reconnection of the meter prongs with the socket ends of the adaptor prongs.

In accordance with the invention, a pair of spaced elongated insulating blocking bars 30,32 are supported within adaptor 10 for movement from a non-blocking position to a blocking position upon removal of unit 16 from wall pan 18. Also supported within adaptor 10 are a plurality of laterally spaced guide members 34 connected to rear wall 20 and projecting inwardly of the adaptor housing. Guide members 34 are vertically positioned whereas blocking bars 30,32 are horizontally positioned, as shown in FIGS. 5 and 6. Guide members 34 and blocking bars 30,32 are made of non-conductive material; such as plastic. Guide members 34 are each formed having an elongated slotted opening or passage 36 through which passes the blocking bars 30,32.

Figure 3:
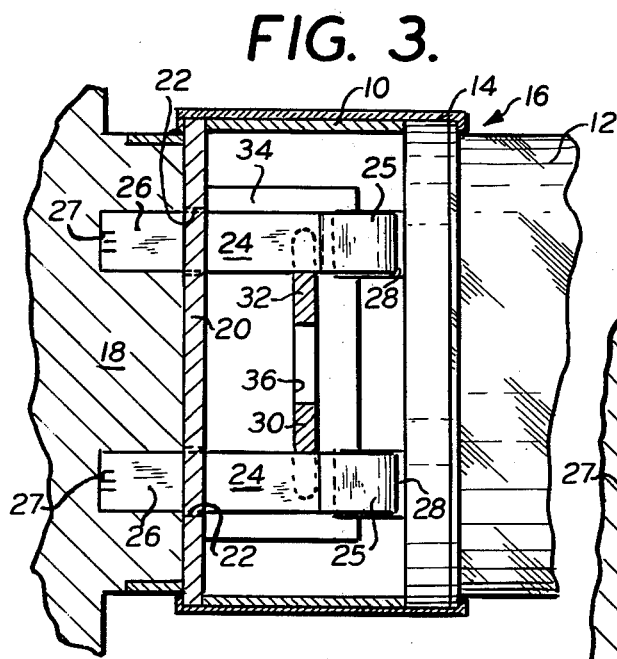
FIG. 3 is a vertical sectional detail view, to an enlarged scale, of the assembled meter and adaptor connected to the wall pan, and showing the engagement of the meter prongs with the socket ends of the adaptor prongs.

Blocking bar 30 is urged in the direction toward the lower edge of slotted openings 36, as viewed in FIGS. 5 and 6, by means of a spring 38 which passes around the edge of center guide member 34 and has its ends connected to bar 30 by fasteners 40 located at separate locations on opposite sides of center guide member 34. Similarly, blocking bar 32 is urged in the direction toward the upper edge of slotted openings 36 by means of spring 42 which also passes around the upper edge of center guide member 34. The ends of spring 42 are similarly connected to bar 32 by fasteners 44. Thus, in order to engage meter prongs 28,28a with the sockets 25 of adaptor prongs 24,24a, it is necessary to first displace blocking bars 30,32 in the direction toward each other to their non-blocking positions as shown in FIGS. 3 and 5. It is contemplated that such connection would be made in the service plant whereupon the entire unit 16 is sealed.

In operation, the arrangement is such that when unit 16 is assembled and mounted on wall pan 18, the blocking bars 30,32 positioned within slots 36 bear against adaptor or extension prongs 24 under influence of spring members 38,42 respectively. It will be appreciated that adaptor prongs 24,24a constitute, in effect, an extension of meter prongs 28, 28a, and are so aligned as to permit proper insertion into the openings 29 pan 18.

As previously indicated, the off-set portions 27 of adaptor prongs 24,24a more firmly secure said prongs to wall pan 18 than are the said prongs secured to the meter prongs 24,28a by means of female sockets 25. Thus, upon pulling unit 16 away from wall pan 18, the female sockets 25 will first disengage from meter prongs 28,28a thereby breaking electrical connection between the meter 12 and adaptor 10. Continued pulling of unit 16 will cause the female sockets 25 to bear against rear wall 20 and thereafter permit the ends 26 of adaptor prongs 24,24a to pull free of pan 18.

Figure 4:
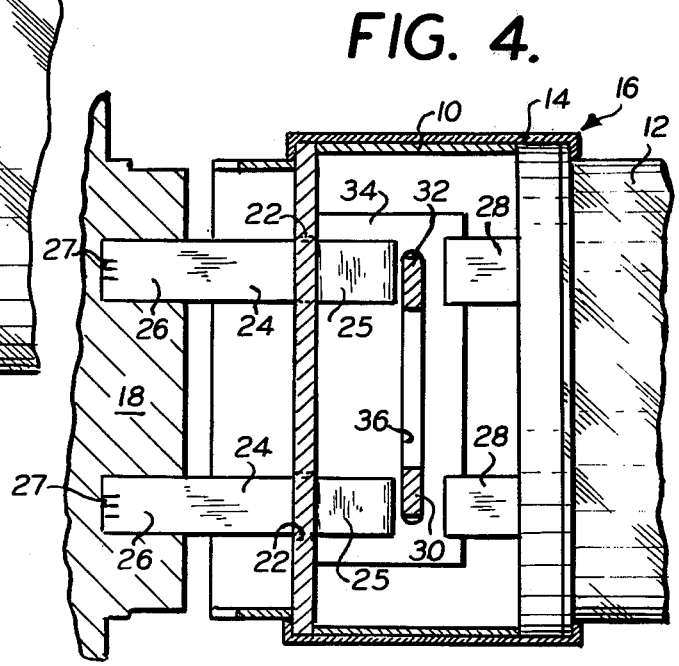
FIG. 4 is a view similar to FIG. 3 but with the assembled meter and adaptor pulled in a direction away from the wall pan to effect disengagement of the meter prongs from the socket ends of the associated adaptor prongs.

Upon disengagement of adaptor prongs 24, 24a from meter prongs 28, 28a, the blocking bars 30, 32 are pulled away from each other and move to their blocking position, as shown in FIGS. 4 and 6, under influence of springs 38 and 42, respectively. The blocking positions correspond to a position wherein the bars 30,32 are located between the ends of meter prongs 28 and the sockets 25 of adaptor prongs 24. The adaptor or extension prongs are now only supported by the openings 22 in rear wall 20 and therefore are free to "flop" around. It will be appreciated that bars 30,32, in their blocking positions, prevent reconnection of meter prongs 28 to adaptor prongs 24 so that the meter 12 can no longer be electrically connected to wall pan 18.

It is further noted that the blocking bars do not interfere with the connection of meter prong 28a and adaptor prong 24a. As a practical matter, these prongs represent the neutral contacts, and it is not necessary to include a blocking mechanism therebetween to practice the invention. Furthermore, the so-called neutral prong 24a of adaptor 10 need not be formed having the off-set portion 27.

Although the preferred embodiment of the invention provides for two separate blocking bars, it will be appreciated that an adaptor having a single adaptor bar to prevent the engagement of two sets of prongs may equally be effective to restrain tampering with the meter. Additionally, the invention can be incorporated directly into the housing of the meter rather than utilizing a separate adaptor which is secured to the meter by means of the sealing collar.

Accordingly, there is provided an adaptor for an electric meter to form an assembly unit and which, after being disconnected from a wall pan, is operative to prevent the assembled unit from being electrically reconnected to the wall pan. The blocking mechanism in the adaptor is mechanically operated to reduce the likelihood of faulty operation often encountered with anti-tampering circuitry systems. If the meter requires repair, the unit is simply disconnected from the wall pan and replaced with a new one while the removed unit is delivered to a service plant for disassembly and repair.

Furthermore, even if a vandal removes the unit from the wall pan, jumps the wires leading to the pan to obtain free use of electricity, and then cuts off the adaptor extension prongs to permit the unit to be remounted to the pan in a flush-like manner, the meter will still not be electrically connected to the pan. Thus, such act of vandalism would be observable and indicated by the inoperative meter gauges which would show that no current is passing through the meter.

While a preferred embodiment of the invention has been shown and described in detail, it will be readily understood and appreciated that numerous omissions, changes and additions may be made without departing from the spirit and scope of the invention.

I claim:

1. A tamper-proof adaptor for an electric meter of the type normally having contact prongs extending from the rear of the meter for insertion into a wall pan to measure electric current flowing therethrough, comprising:
   (a) a housing having a wall with openings therein:
   (b) a plurality of extension prongs, equal in number to the number of contact prongs of the meter, supported within the housing;
   (c) each of said extension prongs having a socket at one end adapted to receive a separate contact prong of the meter, the opposite ends of each of said extension prongs projecting through an opening in said housing wall and adapted to be received in a separate socket of a wall pan to provide electrical contact between said meter and said pan;
   (d) electrical insulator means supported within the housing and disposed for movement from a non-blocking position to a blocking position between said extension and meter prongs;
   (e) bias means operatively connected to said insulator means to move said insulator means to its blocking position when said extension prongs become disengaged from the meter prongs to prevent the engagement thereof and;
   (f) said extension prongs being slideably supported within the housing for movement in a plane intersecting the path of movement of said insulator means, and being positioned to restrain movement of said insulator means to its blocking position when said prongs are engaged with the meter prongs, said extension prongs disengaging from the meter prongs when a force is exerted to disconnect said adaptor from the wall pan thereby to move said extension prongs out of the path of travel of said insulator means and permit movement of said insulator means to its blocking position by said bias means.

2. The adaptor as recited in claim 1, further comprising guide means mounted within the housing for guiding the movement of said insulator means between its non-blocking and blocking position.

3. The adaptor as recited in claim 2, wherein said guide means has an elongated slot and said insulator means comprises a bar having a portion disposed for sliding movement in said slot.

4. The adaptor as recited in claim 3, wherein said bias means comprises a spring operatively connected to said guide means and said insulator bar.

5. The adaptor as recited in claim 1, wherein each of said extension prongs further comprises an off-set portion formed in the end adapted to be forcibly received in the socket of the wall pan, and wherein the force necessary to disengage said extension prongs from the wall pan is greater than the force necessary to disengage said extension prongs from the meter prongs.

6. The adaptor as recited in claim 1, further comprising a collar member disposed circumferentially around said adaptor to form an outer wall closure therefore and adopted to sealing connect said adaptor to the meter when said insulator means is displaced to its non-blocking position and said extension prongs are engaged with the meter prongs thereby to form a unitary device and restrain tampering with said adaptor.

7. A tamper proof adaptor for an electric meter of the type normally having contact prongs extending from the rear of the meter for insertion into a wall pan to measure electric current flowing therethrough comprising:
(a) a housing having a wall with openings therein;
(b) a plurality of extension prongs, equal in number to the number of contact prongs of the meter, slideably supported within the housing;
(c) each of said extension prongs having a socket at one end adapted to receive a separate contact prong of the meter, the opposite ends of each of said extension prongs projecting through an opening in said housing wall and having an off-set portion adapted to be forcibly received in a separate socket of a wall pan to provide electrical contact between said meter and said pan, and wherein the force necessary to disengage said extension prongs from the wall pan is greater than the force necessary to disengage said extension prongs from the meter prongs;
(d) electrical insulator means supported within the housing and disposed for movement from a non-blocking position to a blocking position between said extension and said meter prongs;
(e) guide means mounted within the housing for guiding the movement of said insulator means between its non-blocking and blocking positions;
(f) said extension prongs disposed for movement in a plane intersecting the path of movement of said insulator means and positioned to restrain movement of said insulator means to its blocking position when said prongs are engaged with the meter prongs, said extension prongs disengaging from the meter prongs when a force is exerted to disconnect said adaptor from the wall pan thereby to move said extension prongs out of the path of travel of said insulator means and permit movement of said insulator means to its blocking position; and
(g) spring bias means operatively connected to said insulator means and said guide means to move said insulator means to its blocking position when said extension prongs become disengaged from the meter prongs to prevent re-engagement thereof.

8. The adaptor as recited in claim 7, further comprising a collar member adopted to sealingly connect said adaptor to the meter when said insulator means is displaced to its non-blocking position and said extension prongs are engaged with the meter prongs to form a unitary device and reduce the likelihood of tampering therewith.

* * * * *